United States Patent
Gerbig et al.

(10) Patent No.: US 11,777,044 B2
(45) Date of Patent: Oct. 3, 2023

(54) SOLAR MODULE

(71) Applicant: HANWHA Q CELLS GMBH, Bitterfeld-Wolfen (DE)

(72) Inventors: Christian Gerbig, Bitterfeld-Wolfen (DE); Marcel Kühne, Bitterfeld-Wolfen (DE); Michael Mette, Bitterfeld-Wolfen (DE)

(73) Assignee: HANWHA Q CELLS GMBH, Bitterfeld-Wolfen (DE)

( * ) Notice: Subject to any disclaimer, the term of this patent is extended or adjusted under 35 U.S.C. 154(b) by 0 days.

(21) Appl. No.: 17/778,357

(22) PCT Filed: Nov. 18, 2020

(86) PCT No.: PCT/DE2020/100977
§ 371 (c)(1),
(2) Date: May 19, 2022

(87) PCT Pub. No.: WO2021/098916
PCT Pub. Date: May 27, 2021

(65) Prior Publication Data
US 2023/0006078 A1    Jan. 5, 2023

(30) Foreign Application Priority Data

Nov. 20, 2019 (DE) ............... 10 2019 131 354.6

(51) Int. Cl.
*H01L 31/044* (2014.01)
(52) U.S. Cl.
CPC ................. *H01L 31/044* (2014.12)

(58) Field of Classification Search
CPC .................. H01L 31/042; H01L 31/044
See application file for complete search history.

(56) References Cited

U.S. PATENT DOCUMENTS

| | | | |
|---|---|---|---|
| 6,966,184 B2* | 11/2005 | Toyomura | H02S 40/36 257/E27.123 |
| 7,605,498 B2* | 10/2009 | Ledenev | H02J 3/38 307/80 |

(Continued)

FOREIGN PATENT DOCUMENTS

| | | | |
|---|---|---|---|
| CN | 109713066 A | 5/2019 | |
| EP | 3017520 B1 * | 10/2020 | ........... H01L 31/044 |

(Continued)

*Primary Examiner* — Golam Mowla
(74) *Attorney, Agent, or Firm* — Christensen, Fonder, Dardi & Herbert PLLC

(57) ABSTRACT

A solar module having at least two substring groups, each including an upper substring having solar cells connected in series and arranged in a matrix having two adjacent columns and a plurality of rows, and a lower substring having solar cells connected in series and arranged in a matrix having two adjacent columns and a plurality of rows. The lower and upper substrings include the same number of solar cells. A cross-connector interconnects the lower and upper substrings electrically in parallel forming the substring group. A bypass diode is arranged electrically in the cross-connector, and cross-connectors of each substring group are interconnected electrically in series. Two columns of the lower substring include a different number of solar cells and two columns of the upper substring include a different number of solar cells, such that the number of solar cells of the upper substring and of the lower substring is odd.

10 Claims, 1 Drawing Sheet

(56) References Cited

U.S. PATENT DOCUMENTS

| | | | |
|---|---|---|---|
| 9,184,312 B2* | 11/2015 | Takano | H01L 31/02021 |
| 9,397,497 B2* | 7/2016 | Ledenev | H02J 3/381 |
| 2003/0062078 A1* | 4/2003 | Mimura | H01L 31/044 |
| | | | 136/244 |
| 2003/0106579 A1 | 6/2003 | Chang | |
| 2011/0226305 A1* | 9/2011 | Chen | H01L 31/042 |
| | | | 136/244 |
| 2012/0285510 A1 | 11/2012 | Löckenhoff | |
| 2013/0068278 A1* | 3/2013 | Kataoka | H01L 31/042 |
| | | | 257/E29.022 |
| 2013/0269747 A1 | 10/2013 | Lentine et al. | |
| 2016/0013344 A1* | 1/2016 | Flynn | H01L 31/035281 |
| | | | 136/244 |

FOREIGN PATENT DOCUMENTS

| | | | | |
|---|---|---|---|---|
| EP | 3 959 748 A1 | | 3/2022 | |
| GB | 2515837 A | * | 1/2015 | H01L 31/044 |
| GB | 2564123 A | * | 1/2019 | H01L 31/042 |
| WO | WO 2011/061265 A2 | | 5/2011 | |
| WO | WO 2020/216912 A1 | | 10/2020 | |

* cited by examiner ial applications
SOLAR MODULE

RELATED APPLICATIONS

The present application is a National Phase entry of PCT Application No. PCT/DE2020/100977, filed Nov. 18, 2020, which claims priority to German Patent Application No. 10 2019 131 354.6, filed Nov. 20, 2020, the disclosures of which are hereby incorporated by reference herein in their entirety.

FIELD OF THE INVENTION

The invention relates to a solar module. In particular, the invention relates to a solar module having at least two substring groups.

BACKGROUND OF THE INVENTION

A solar module is known from a prior art that is not documented in printed form and is illustrated in FIG. 1.

FIG. 1 illustrates the solar module that has a substring group A, a substring group B and a substring group C. Each substring group A,B,C has an upper substring A1,B1,C1 having a number of solar cells 11 that are connected in series. The number N of the solar cells 11 that are connected in series can be arbitrary but must be N≥2 in order to be able to ensure an interconnection. The solar cells 11 of the upper substring A1,B,C1 are arranged in a matrix form comprising two adjacent columns having as an example twelve rows, wherein the solar cells 11 are designed as twenty four so-called half cells since they were cut into two halves after the solar cells had been manufactured. Furthermore, each substring group A,B,C has a lower substring A2,B2,C2 having a number of solar cells 21 that are connected in series. The solar cells 21 are likewise arranged in a matrix form comprising two adjacent columns and twelve rows, wherein the solar cells 21 are also designed as twenty four half cells. The lower substring A2,B2,C2 and the upper substring A1,B1,C1 have the same number of solar cells 11,21 that are both connected in parallel to one another. Internally, in each case twenty four solar cells 11,21 in the form of half cells are connected in series per substring, A1,B1,C1,A2,B2,C2. Consequently, a total of six times twenty four half cells are connected to one another in the solar module.

Furthermore, the solar module has a transverse connector 3 that respectively electrically connects the lower substring A2,B2,C2 and the upper substring A1,B1,C1 in parallel to form the substring group A,B,C. The transverse connector 3 of each substring group A,B,C are in contact with one another with the result that the substring groups A,B,C are electrically connected to one another in series. The transverse connectors 3 are arranged centrally in the solar module.

Furthermore, the solar module has three bypass diodes 4 that are arranged electrically in the transverse connector 3. Each bypass diode 4 is allocated respectively to one of the substring groups A,B,C and respectively protects two times twenty four solar cells 11,21 inside the module.

The transverse connector 3 and the bypass diodes 4 are each placed centrally. By virtue of dividing the solar module into two identically sized halves using the transverse connector 3 and the bypass diodes 4, if the solar module is installed in an upright position the extent of partial shading of the lower substring is not as great as in the case of the solar module in which the bypass diodes are not arranged centrally. On account of the centrally placed bypass diodes 4, the solar module can furthermore still produce up to 50% of the power even if there is a partial shading of the solar module. The expressions "upper" and "lower" substring are to be understood to mean that the two substrings of the substring group are arranged in such a manner with respect to one another.

Solar modules are usually produced with different lengths and width dimensions in order to meet different size requirements for example on roofs or facades of buildings. However, in the case of the solar module construction illustrated in FIG. 1, it is necessary to increase the number of solar cells for each substring group by at least two rows—in other words one row for each substring—in order to change the size of the solar module in the vertical direction. The reason for this is that the solar module is only functional if the lower substring and the upper substring of the substring group that is electrically connected in parallel to said lower substring has the same number of identical solar cells.

It is preferred that a solar module is provided with square or essentially square solar cells during the manufacturing process. Solar cells of this type are designed as full cells, whereas half cells represent two halves of a full cell that have been cut into halves during the manufacturing process. Furthermore, it is also possible for manufactured cells to be cut into thirds, quarters or fifths and to assembly these part cells to form solar modules. Full cells have for example an edge length of approx. 156 mm×156 mm, which are also described as 6-inch-(6"-) cells. The full cells can however also have other sizes.

In the solar module that is illustrated as an example in FIG. 1, the solar cells 11,21 are provided as half cells since they are cut into two halves. These solar cells 11, 12 are arranged in such a manner that their arrangement alone produces a specific size of solar module. A typical size of solar module that represents a standard size is produced by predetermined distances between the half cells of by way of example 4 to 5 mm and where appropriate edge distances to a frame of the solar module in the region of a few centimeters.

Therefore, varying sizes of solar modules having standard dimensions are produced depending upon the number of solar cells installed in the solar module. The standard dimensions are produced in particular since mostly three substring groups each having two columns per substring are installed in a solar module.

By way of example, the solar module that is illustrated in FIG. 1 with the three substring groups A,B,C and the twenty four solar cells 11,21 per substring group A1,B1,C1,A2,B2, C2 has the solar cells 11,12 in the form of half cells with a width of 156.75 mm, height of 78.38 mm and a surface area of 122.16 cm². The columns of the substring groups A,B,C then extend for 24 solar cells per substring over approx. 2.000 mm. In the case of a solar module that corresponds to the solar module that is illustrated in FIG. 1 with the difference that it has twenty six solar cells per substring group, in contrast the columns of the substring groups A,B,C extend over approx. 2.200 mm. In the case of a solar module that corresponds to the solar module that is illustrated in FIG. 1 with the difference that it has twenty two solar cells per substring group, the columns of the substring groups A,B,C then extend over approx. 1.800 mm.

A solar module having a comparable construction to the solar module that is illustrated in FIG. 1 has therefore standard dimensions that vary depending upon the number of solar cells per substring and the number of substring groups but on account of the standard size of solar cells the size change of said solar module is relatively fixedly predetermined and in the event that the number of solar cells changes it has a relatively large size change in the vertical direction.

It is however desirable to provide a solar module that renders possible a more finely granulated vertical size change and in particular intermediate sizes.

In particular, if the solar module is to be integrable in the roof region or in the architecture region for example as a facade element, it is desirable to change the solar module size in relatively fine granulated size changes. This is furthermore desirable in order to improve the laminator loading in the production process since laminators often have fixed length and width dimensions that are dimensioned in such a manner that multiple solar module laminates that have defined dimensions are laminated jointly in a laminator, in order that the throughput can be increased in this manner. An attempt is made to fill the area in the laminator with as many adjacently arranged solar module laminates as possible. If the dimensions of the solar module laminates change in comparatively coarse gradations, the state in which fewer adjacent solar module laminates can be processed in the laminator is reached more quickly.

SUMMARY

It is therefore the object of the invention to provide a solar module that renders possible a more finely granulated vertical size change. This object is achieved by virtue of a solar module having the features of claim 1.

It is provided in accordance with the invention that two columns of the lower substring have a different number of solar cells and that two columns of the associated upper substring in the substring group has a different number of solar cells with the result that the number of solar cells of the upper substring and the number of solar cells in the lower substring is uneven.

This construction renders it possible to increase the substring group in the vertical direction by a row of solar cells with the result that this size change of the solar module in comparison to conventional designs is half the size. As a consequence, a smaller change in the vertical solar module size is realized than in the prior art. As a consequence, new solar module sizes are provided that are designed as intermediate sizes between known standard sizes. This also has the advantage that the laminators for laminating the solar module laminates can be used in a more space-efficient manner.

In a preferred embodiment, the upper substring and the associated lower substring in the substring group are oriented and designed in such a manner that when exposed to the same amount of light they generate the same electrical voltage. The expression "the same electrical voltage" is to be understood to mean the same electrical voltage within measurement error tolerances. If the upper and the lower substring of a substring group are not designed so as when exposed to the same amount of light to generate the same electrical voltage, compensating currents will flow that render the solar module inoperable or at least unprofitable.

It is preferred that the upper substring and the lower substring each have solar cells that have identical dimensions and are arranged in two adjacent columns. As a consequence, the substrings can fill the solar module area in an efficient manner.

The solar cells can be designed as full cells. The size of the individual full cell depends inter alia upon the method used to produce the solar cells. By way of example, the size of a silicon wafer full cell amounts to 156 mm×156 mm, in other words the full cell is a so-called 6-cell- (6"-) cell. It is preferred that the full cells are designed in a square or essentially square manner.

In a preferred embodiment, the solar cells are designed as half cells. Half cells are solar cells that are cut into two halves after they had been manufactured in the form of full cells. By virtue of dividing the cell, a total surface area of the cell intermediate spaces on the solar module surface area is increased in comparison to a total surface area of the cell intermediate spaces in the case of corresponding solar cells that are not divided. This produces a greater reflection gain over the rear side film. Furthermore, electrical power losses are reduced by virtue of the current being halved per substring and by providing a greater number of cell connectors. By virtue of designing the solar cells as half cells, it is furthermore possible to realize a more finely granulated size change of the solar module than when the solar cells are designed as full cells if solar cells are added or omitted in the substrings. Beyond the preferred design as half-cells, it is also possible for manufactured cells to be cut into thirds, quarters or fifths and to assembly these part cells respectively to form solar modules.

It is preferred that at least two substring groups are electrically connected to one another in series. It is preferred that three substring groups are electrically connected to one another in series. It is preferred that the solar cells of the solar modules are arranged in six columns, in other words each of the three substring groups has two columns.

The substring groups that are connected to one another in series can be designed in such a manner that they each generate different electrical voltages when exposed to light. In a preferred embodiment, the substring groups are designed in such a manner that they each generate the same voltage when exposed to the same amount of light.

It is preferred that a bypass diode is allocated respectively to each substring group in the region of the electrical parallel interconnection between the associated upper substring and the associated lower substring. As a consequence, considerably more power can be generated in the event of partial shading of the solar module surface than without the use of bypass diodes.

It is preferred that all substring groups have the same number of solar cells. As a consequence, a solar module is provided that can be produced as a rectangle in a simple manner. Consequently the solar cells that are usually of a square or rectangular design are arranged in a rectangular solar module in a space-saving manner.

In a preferred embodiment, one of the substring groups has a different number of solar cells than the other substring group or the other substring groups. As a consequence, the solar module can be adapted to a desired geometry.

It is preferred that the solar cells are designed as silicon wafer solar cells. The half cells which are preferably used can be cut in a simple manner from said silicon wafer solar cells.

BRIEF DESCRIPTION OF THE DRAWINGS

An exemplary embodiment of the invention is illustrated in the drawings in a purely schematic view and is further described below. In the drawings in a purely schematic and not-to-scale view.

DETAILED DESCRIPTION

Figure 1:
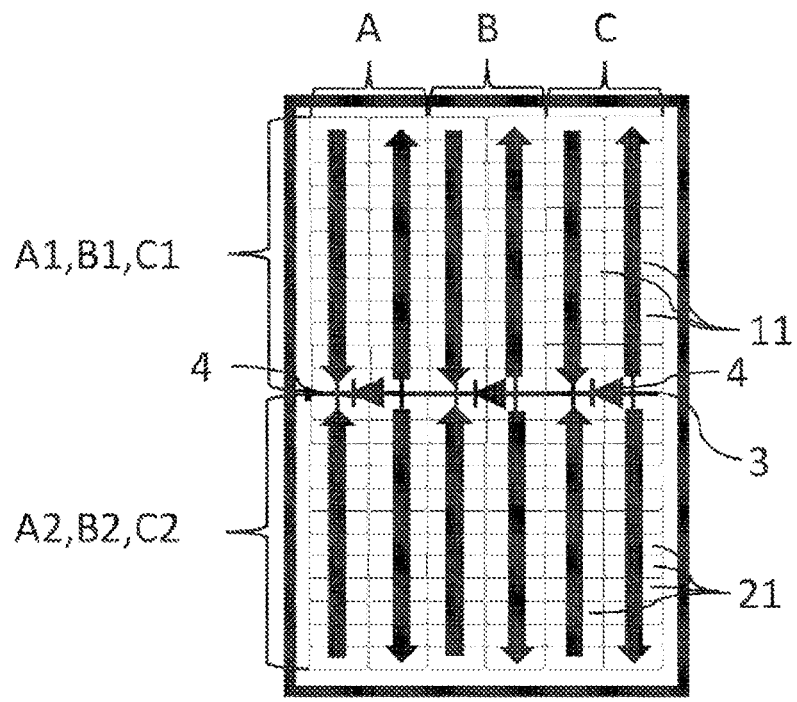
FIG. 1 illustrates a plan view of a solar module in accordance with the prior art.

FIG. 1 illustrates a plan view of a solar module in accordance with the prior art and has already been described in the introduction to the description. Therefore, to avoid repetitions, reference is made to the above description.

Figure 2:
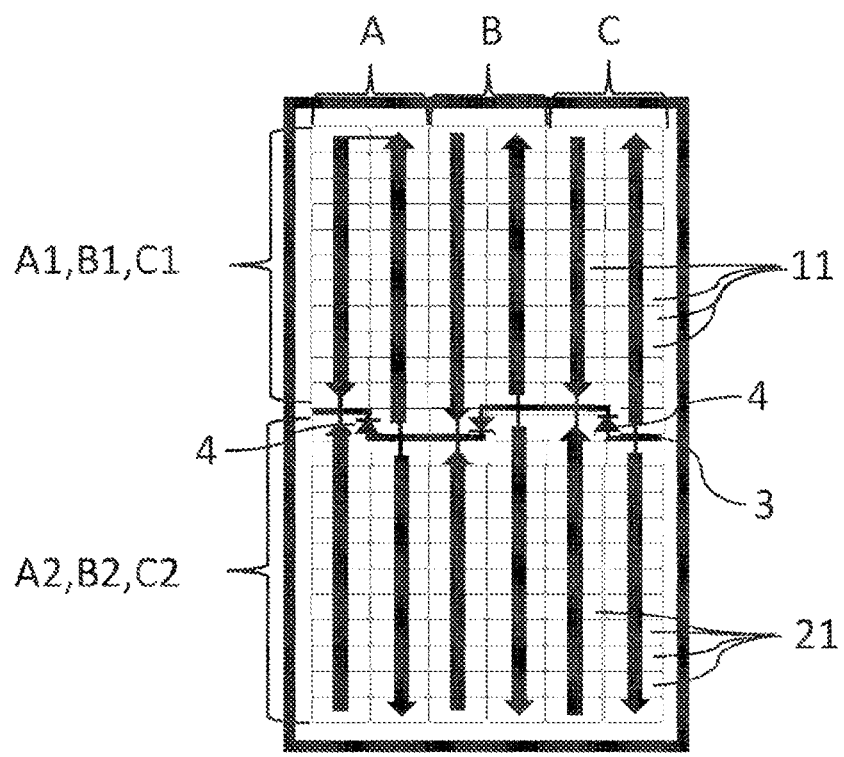
FIG. 2 illustrates a plan view of a solar module in accordance with the invention.

FIG. 2 illustrates a plan view of a solar module in accordance with the invention. The solar module illustrated in FIG. 2 corresponds to the solar module illustrated in FIG. 1 with the difference that two columns of the lower substring A2,B2,C2 have a different number of solar cells 21 and that two columns of the associated upper substring A1,B1,C1 in the substring group A,B,C have a different number of solar cells 11 with the result that the number of solar cells 11 of the upper substring A1,B1,C1 and the number of solar cells 21 in the lower substring A2,B2,C2 is uneven.

The lower substring A2,B2,C2 and the upper substring A1,B1,C1 have in each case the same number of solar cells 11,21. The solar cells 11 of the upper substring A1, B1,C1 and the solar cells 21 of the lower substring A2,B2,C2 are each arranged in a matrix form comprising two adjacent columns and multiple rows, wherein the solar cells 11 and the solar cells 21 are each designed as twenty three half cells per substring A1,B1,C1,A2,B2,C2. Internally, in each case twenty three solar cells 11,21 in the form of half cells are connected in series for each substring, A1,B1,C1,A2,B2,C2. Consequently, a total of six times twenty three solar cells 11,21 are connected in parallel in the solar module.

Furthermore, the solar module has the transverse connectors 3 that respectively electrically interconnect the lower substring A2,B2,C2 and the upper substring A1,B1,C1 in parallel to form the substring group A,B,C. However, the transverse connectors 3 run in the electrical circuit routing in a meandering manner in the solar module. Each bypass diode 4 is allocated respectively to one of the substring groups A,B,C and respectively protects two times twenty four solar cells 11,21 inside the module.

LIST OF REFERENCE NUMERALS

A1 Upper substring of the substring group A
A2 Lower substring of the substring group A
A Sub string group A1+A2
B1 Upper substring of the substring group B
B2 Lower substring of the substring group B
B Sub string group B1+B2
C1 Upper substring of the substring group C
C2 Lower substring of the substring group C
C Sub string group C1+C2
11 Solar cells of the upper substring
21 Solar cells of the lower substring
3 Transverse connector
4 Bypass diodes

The invention claimed is:

1. A solar module having at least two substring groups, each substring group comprising
   an upper substring having a number of solar cells that are connected in series, wherein the solar cells of the upper substring are arranged in a matrix form comprising at least two adjacent columns and multiple rows,
   a lower substring having a number of solar cells, that are connected in series, wherein the solar cells are arranged in a matrix form comprising at least two adjacent columns and multiple rows and wherein the lower substring and the upper substring have the same number of solar cells
   a transverse connector electrically connecting the lower substring and the upper substring in parallel to form the substring group and
   a bypass diode that is electrically arranged in the transverse connector,
   wherein the transverse connector of each substring group are in contact with one another in such a manner that the substring groups are electrically connected to one another in series, and
   two columns of the lower substring have a different number of solar cells and two columns of the associated upper substring in the substring group have a different number of solar cells, with a result that the number of solar cells of the upper substring and the number of solar cells in the lower substring is uneven.

2. The solar module as claimed in claim 1, wherein the upper substring and the associated lower substring in the substring group are oriented and designed in such a manner that when exposed to a same amount of light they generate the same electrical voltage.

3. The solar module as claimed in claim 1, wherein the upper substrings and the lower substrings each have solar cells that have identical dimensions and are arranged in two adjacent columns.

4. The solar module as claimed in claim 1, wherein the solar cells are designed as half cells.

5. The solar module as claimed in claim 1, wherein at least two substring groups are electrically connected to one another in series.

6. The solar module as claimed in claim 1, wherein the two substring groups are designed in such a manner that they each generate a same voltage or different electrical voltages.

7. The solar module as claimed in claim 1, wherein a bypass diode is allocated respectively to each substring group in a region of the electrical parallel interconnection between the associated upper substring and the associated lower substring.

8. The solar module as claimed in claim 1, wherein all substring groups have the same number of solar cells.

9. The solar module as claimed in claim 1, wherein one of the substring groups has a different number of solar cells than the other substring group or the other substring groups.

10. The solar module as claimed in claim 1, wherein the solar cells are designed as silicon wafer solar cells.

* * * * *